(12) United States Patent
Okura et al.

(10) Patent No.: US 10,000,697 B2
(45) Date of Patent: Jun. 19, 2018

(54) MAGNESIUM ALUMOSILICATE-BASED PHOSPHOR

(71) Applicant: Merck Patent GmbH, Darmstadt (DE)

(72) Inventors: Hiroshi Okura, Hiratsuka (JP); Takeo Wakimoto, Tokyo (JP); Katsuyuki Matsui, Yokohama (JP); Noriyuki Matsuda, Chiba (JP)

(73) Assignee: Merck Patent GmbH, Darmstadt (DE)

( * ) Notice: Subject to any disclaimer, the term of this patent is extended or adjusted under 35 U.S.C. 154(b) by 310 days.

(21) Appl. No.: 14/778,807

(22) PCT Filed: Feb. 24, 2014

(86) PCT No.: PCT/EP2014/000479
§ 371 (c)(1),
(2) Date: Sep. 21, 2015

(87) PCT Pub. No.: WO2014/146748
PCT Pub. Date: Sep. 25, 2014

(65) Prior Publication Data
US 2016/0053170 A1  Feb. 25, 2016

(30) Foreign Application Priority Data

Mar. 22, 2013 (EP) .................................... 13001499

(51) Int. Cl.

| | | |
|---|---|---|
| *H01L 33/00* | (2010.01) | |
| *C09K 11/77* | (2006.01) | |
| *H01J 1/63* | (2006.01) | |
| *H01J 61/44* | (2006.01) | |
| *H01L 33/50* | (2010.01) | |
| *F21V 9/16* | (2006.01) | |
| *G02B 5/20* | (2006.01) | |
| *H01L 33/32* | (2010.01) | |
| *F21K 9/64* | (2016.01) | |
| *H01L 31/0232* | (2014.01) | |
| *H01L 31/055* | (2014.01) | |
| *H01L 31/054* | (2014.01) | |

(52) U.S. Cl.
CPC ...... *C09K 11/7734* (2013.01); *C09K 11/7774* (2013.01); *F21K 9/64* (2016.08); *F21V 9/16* (2013.01); *G02B 5/208* (2013.01); *H01J 1/63* (2013.01); *H01J 61/44* (2013.01); *H01L 33/32* (2013.01); *H01L 33/502* (2013.01); *H01L 31/0232* (2013.01); *H01L 31/02322* (2013.01); *H01L 31/054* (2014.12); *H01L 31/055* (2013.01); *Y02E 10/52* (2013.01)

(58) Field of Classification Search
CPC ... C09K 11/7734; C09K 11/7774; F21K 9/64; Y02E 10/52; H01L 33/503; H01L 31/02322; H01L 31/055; H01L 31/0232; H01L 31/054
See application file for complete search history.

(56) References Cited

U.S. PATENT DOCUMENTS

| | | | |
|---|---|---|---|
| 7,648,650 B2 | 1/2010 | Liu et al. | |
| 7,952,279 B2 * | 5/2011 | Honda | C09K 11/595 252/301.4 H |
| 8,975,619 B2 | 3/2015 | Okura et al. | |
| 2008/0020236 A1 | 1/2008 | Shunichi et al. | |
| 2008/0111472 A1 | 5/2008 | Liu et al. | |
| 2010/0259161 A1 | 10/2010 | Lee et al. | |
| 2013/0153882 A1 | 6/2013 | Okura et al. | |

FOREIGN PATENT DOCUMENTS

| | | |
|---|---|---|
| CN | 101595201 A | 12/2009 |
| CN | 101935204 A | 1/2011 |
| WO | 2012/025185 A1 | 3/2012 |

OTHER PUBLICATIONS

Chinese Office Action dated Sep. 1, 2016 issued in corresponding CN 201480017137.6 application (6 pages).
J.M. Robertson et al., "Colourshift of the Ce3+ Emission in Monocrystalline Epitaxially Grown Garnet Layers", Phillips J. Res., vol. 36 (1981) pp. 15-30.
L. Jiang et al., "Luminescent Properties of CaMgSi2O6 and Ca2MgSi2O7 Phosphors Activated by Eu2+, Dy3+ and Nd3+", Journal of Alloys and Compounds, vol. 360 (2003) pp. 193-197.
International Search Report dated Apr. 9, 2014 issued in corresponding PCT/EP2014/000479 application (pp. 1-4).
S.H. Lee et al., "White-Light-Emitting Phosphor: CaMgSi2O6:Eu2+, Mn2+ and its Related Properties with Blending", Applied Physics Letters, vol. 89, No. 22 (Nov. 30, 2006) pp. 221916.
W.J. Yang et al., "Luminescence and Energy Transfer of Eu- and Mn-Coactivated CaAl2Si2O8 as a Potential Phosphor for White-Light UVLED", Chemistry of Materials, vol. 17, No. 15 (Jun. 21, 2005) pp. 3883-3888.
X. Chen et al., "Synthesis of Blue Long-Lasting Phosphorescent Material Sr2MgSi2OEu2+, Dy3+ by Coprecipitation Method", Chinese Journal of Inorganic Chemistry, vol. 26, No. 1 (2010) pp. 79-83.

* cited by examiner

*Primary Examiner* — C Melissa Koslow
(74) *Attorney, Agent, or Firm* — Millen White Zelano and Branigan, PC; Csaba Henter

(57) ABSTRACT

The invention relates to co-activated magnesium alumosilicate based phosphors, to a process of its preparation, the use of these phosphors in electronic and electro optical devices, such as light emitting diodes (LEDs) and solar cells and especially to illumination units comprising said magnesium alumosilicate-based phosphors.

20 Claims, 4 Drawing Sheets

MAGNESIUM ALUMOSILICATE-BASED PHOSPHOR

TECHNICAL FIELD

The invention relates to co-activated magnesium alumosilicate based phosphors, to a process of the preparation of these phosphors, the use of these phosphors in electronic and/or electro optical devices, such as light emitting diodes (LEDs) and solar cells, and especially to illumination units comprising said phosphors.

BACKGROUND ART

White light-emitting diodes (LEDs) exhibit high efficiency, long lifetimes, less environmental impact, absence of mercury, short response times, applicability in final products of various sizes, and many more favorable properties. They are gaining attention as backlight sources for liquid crystal displays, computer notebook monitors, cell phone screens, and in general lighting.

As known to the expert, white LEDs can be obtained by adding a yellow emitting phosphors, such as YAG:Ce, which exhibits an emission peak wavelength around 560 nm, to a blue light emitting LED. The emitted peak wavelength of corresponding blue light emitting LEDs is typically in the range from 450 to 470 nm. Therefore, only a limited number of phosphors can be used in order to obtain white LEDs because the phosphors need to absorb light in the range emitted from the blue LED.

By combining red, green, and blue emitting phosphors with an near UV LED, which typically emits light at a wavelength ranging from 280 to 400 nm, as a primary light source, it is possible to obtain a tri-color white LED with better luminescence strength and superior white color in comparison to the above described white LEDs. Consequently, there is a considerable demand for phosphors excitable at wavelength ranging from 280 nm to 400 nm.

To obtain such white LEDs by using UV-LEDs or near UV-LEDs, typically a red, a green, and a blue emitting phosphor are first mixed in a suitable resin. The resultant gel is then provided on a UV-LED chip or a near UV-LED chip and hardened by UV irradiation, annealing, or similar processes. The phosphor mixture in the resin should be as homogeneously dispersed as possible in order to observe an even, white color, while looking at the chip from all angles. However, it is still difficult to obtain a uniform distribution of the different phosphors in the resin because of their different particle sizes, shapes and/or their density in the resin. Hence, it is advantageous to use less than three phosphors or even only one phosphor. For example, the use of a phosphor having two or more main emission peaks at different wavelengths represents a potential solution of the above-mentioned problem.

In this connection, Sung Hun Lee, Je Hong Park, Se Mo Son, and Jong Su Kima disclose in Appl. Phys. Lett. 2006, 89, 221916, a $CaMgSi_2O_6:Eu^{2+}$, $Mn^{2+}$ phosphor exhibiting three emission bands peaks at around 450 nm, 580 nm, and 680 nm with main peaks at 440 nm and 680 nm. Since the most preferred spectral range for a human eye is between 400 and 650 nm, the emission peak at 680 nm is located on the edge of the visible range. Moreover, a mixture of green-poor $CaMgSi_2O_6:Eu^{2+}$, $Mn^{2+}$ and green-to-yellow emissive $(BaSr)_2SiO_4:Eu^{2+}$ is needed in order to achieve white light having correlated color temperatures from 4845 to 9180 K and color rendering indices from 71% to 88%.

However, even by using a mixture of two phosphors, in order to produce white LEDs using UV or near UV-LEDs, it is still difficult to uniformly mix phosphors having different sizes, particle shapes and densities in the resin. Moreover, the phosphors should not be excited by a wavelength located in the visible range. For instance, if the emission spectrum of the green phosphor overlaps with the excitation spectrum of the red phosphor, then color tuning becomes difficult. Additionally, if a mixture of two or more phosphors is used to produce white LEDs using a blue emitting LED as the primary light source, the excitation wavelength of each phosphor should efficiently overlap with the blue emission wavelength of the LED.

An example of a white LED using UV or near UV-LED as the primary light source and the use of only one phosphor is given by Woan-Jen Yang, Liyang Luo, Teng-Ming Chen, and Niann-Shia Wang in Chem. Mater., 2005, 17 (15), 3883-3888. The authors describe an alumosilicate-based phosphor of the general formula $CaAl_2Si_2O_8: Eu^{2+}$, $Mn^{2+}$, exhibiting a main emission peak centred at 425 nm and a broad emission band centred at 586 nm.

Another example of a white LED comprising a UV or near UV-LED primary light source and only one phosphor is given in US 2010/0259161 A, which discloses a co-activated phosphor based on the formula $CaMg_2Al_6Si_9O_{30}$. The main emission peaks of the described phosphor are centred at 467 nm and 627 nm, respectively. However, the emission ranges up to 800 nm, which is outside of the range most sensitive to the human eye.

Accordingly, there is still room for improvements and modern luminescent materials, preferably

- exhibit high colour rendering indices,
- exhibit at least two emission bands in the range of the VIS-light, preferably in the range of the VIS light which is in particular most sensitive to the human eye,
- are effectively excitable by an UV or near UV emitting primary light source,
- exhibit high quantum yields,
- exhibit high efficiency over a prolonged period of use,
- have high chemical stability, preferably against humidity or moisture
- exhibit lower thermal quenching resistivity
- are obtainable by method of production, which has to be cost efficient and especially suitable for a mass production process.

In view of the cited prior art and the above-mentioned requirements on modern luminescent materials, there is still a considerable demand for alternative materials, which preferably do not exhibit the drawbacks of available phosphors of prior art or even if do so, to a less extend.

DISCLOSURE OF INVENTION

Surprisingly, the inventors have found that co-activated magnesium alumosilicate based phosphors represent excellent alternatives to already known phosphors of the prior art, and preferably, improve one or more of the above-mentioned requirements in view of the prior art, or more preferably, fulfil all above-mentioned requirements at the same time.

Besides other beneficial properties, the phosphors according to the present invention exhibit upon excitation by UV or near UV radiation at least two main emission peaks in the range of VIS-light, preferably in the VIS light range which is most sensitive to the human eye. Moreover, they exhibit a low thermal quenching resistivity, have high chemical stability, and have high colour rendering properties.

Thus, the present invention relates to a compound of formula I, $$(M)(Mg_{1-z}Al_z)(Si_{2-z}T_z)O_6: \text{at least two of ABC} \quad \text{I}$$

wherein,

M denotes at least one alkaline earth element selected from Ca, Sr, or Ba,

T denotes at least one trivalent element selected from Al, Ga, In, or Sc,

A and B denote, each differently from another, a divalent element selected from $Pb^{2+}$, $Mn^{2+}$, $Yb^{2+}$, $Sm^{2+}$, $Eu^{2+}$, $Dy^{2+}$, or $Ho^{2+}$, and C denotes a trivalent element selected from $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, or $Bi^{3+}$, with the proviso that at least two elements selected from A, B or C have to be present, and $0<z<0.75$.

The invention further relates to a method for the production of the compounds according to the present invention, the use of a compound according to the present invention as a conversion phosphor converting all or some parts of a UV or near UV radiation into longer wavelength, mixtures comprising at least one compound according to the present invention; the use of a compound according to the present invention or a mixture comprising a compound according to the present invention in electronic and/or electro optical devices, such as light emitting diodes (LEDs) and solar cells, and especially to illumination units and LCD backlights comprising the compounds according to the present invention.

DETAILED DESCRIPTION OF THE INVENTION

Figure 1:
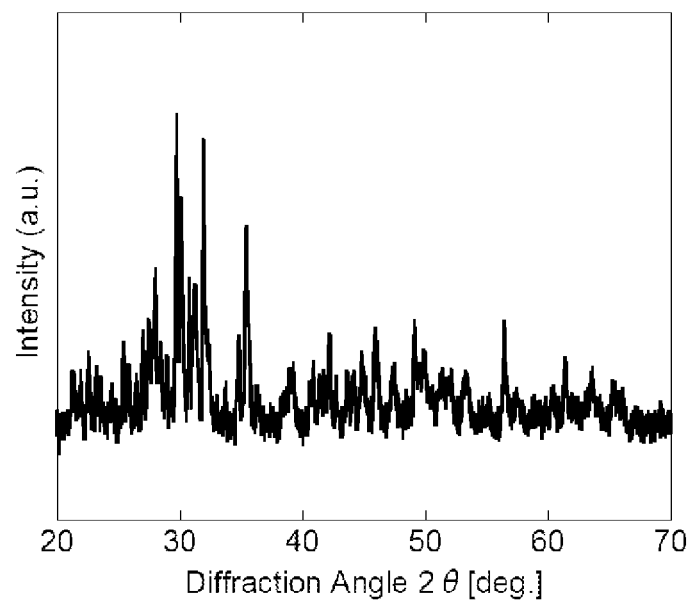
FIG. 1 shows a XRD pattern (measured by the wavelength $Cu_{K\alpha}$) of $(Ca_{0.8})(Mg_{0.65}Al_{0.15})(Si_{1.85}Al_{0.15})O_6:(Mn^{2+})_{0.2}(Eu^{2+})_{0.2}$ prepared by the co-precipitation method as illustrated in Example 1.

In a preferred embodiment of the present invention, the compounds of formula I are selected from the compounds of formula Ia, $$(M_{1-x-u-p})(Mg_{1-z-v-q}Al_{z-m})(Si_{2-z}T_{z-n})O_6: A_xB_yC_w \quad \text{Ia}$$

wherein M, T, A, B and C have the same meanings as mentioned above in formula I, $m+n+q+p=w$, whereby $m \geq 0$, $n \geq 0$, $p \geq 0$, and $q \geq 0$, $u+v=y$, whereby $v \geq 0$, and $u \geq 0$, $0 \leq w < 0.3$, $0 \leq x < 0.5$, $0 \leq y < 0.5$, where at least two of the indices w, x and y are >0, and $0 < z < 0.5$.

Preferably, the compounds of formula I are selected from the group of compounds of formula Ia, wherein T denotes Al, and/or $w=0$, and/or A denotes $Eu^{2+}$, and/or B denotes $Mn^{2+}$.

More preferably, the compounds according to the present invention are selected from the group of compounds of formulae Ia-1 to Ia-7, $$((Sr_sBa_rCa_t)_{1-x-u})(Mg_{1-z-v}Al_z)(Si_{2-z}Al_z)O_6:(Eu^{2+})_x(Mn^{2+})_y \quad \text{Ia-1}$$

$$((Ca_rBa_r)_{1-x-u})(Mg_{1-z-v}Al_z)(Si_{2-z}Al_z)O_6:(Eu^{2+})_x(Mn^{2+})_y \quad \text{Ia-2}$$

$$((Sr_sBa_r)_{1-x-u})(Mg_{1-z-v}Al_z)(Si_{2-z}Al_z)O_6:(Eu^{2+})_x(Mn^{2+})_y \quad \text{Ia-3}$$

$$((Sr_sCa_t)_{1-x-u})(Mg_{1-z-v}Al_z)(Si_{2-z}Al_z)O_6:(Eu^{2+})_x(Mn^{2+})_y \quad \text{Ia-4}$$

$$(Sr_{1-x-u})(Mg_{1-z-v}Al_z)(Si_{2-z}Al_z)O_6:(Eu^{2+})_x(Mn^{2+})_y \quad \text{Ia-5}$$

$$(Ba_{1-x-u})(Mg_{1-z-v}Al_z)(Si_{2-z}Al_z)O_6:(Eu^{2+})_x(Mn^{2+})_y \quad \text{Ia-6}$$

$$(Ca_{1-x-u})(Mg_{1-z-v}Al_z)(Si_{2-z}Al_z)O_6:(Eu^{2+})_x(Mn^{2+})_y \quad \text{Ia-7},$$

wherein, $0<r<1$; $0<s<1$; $0<t<1$; whereby $r+s+t=1$, $u+v=y$, whereby $v \geq 0$, $u \geq 0$, whereby at least one of the indices u and v, has to be larger than 0, $0.1<x<0.3$, $0.1<y<0.3$, and $0.05<z<0.4$.

Especially preferred compounds are selected from the group of compounds of formulae Ia-1, Ia-2, Ia-4 and Ia-7, and more preferably from the group of compounds of formulae Ia-2, Ia-4 and Ia-7, wherein x, y both are 0.15 to 0.2, and/or u is 0.

Particularly preferred compounds are selected from the group of compounds of formulae Ia-2a, Ia-4a and Ia-7a, $$((Ca_rBa_r)_{0.8})(Mg_{0.8-z}Al_z)(Si_{2-z}Al_z)O_6:(Eu^{2+})_{0.2}(Mn^{2+})_{0.2} \quad \text{Ia-2a}$$

$$((Sr_sCa_t)_{0.8})(Mg_{0.8-z}Al_z)(Si_{2-z}Al_z)O_6:(Eu^{2+})_{0.2}(Mn^{2+})_{0.2} \quad \text{Ia-4a}$$

$$Ca_{0.8}(Mg_{0.8-z}Al_z)(Si_{2-z}Al)O_6:(Eu^{2+})_{0.2}(Mn^{2+})_{0.2} \quad \text{Ia-7a}$$

wherein,
$0<r<1$; $0<s<1$; $0<t<1$, preferably $0.75<r<1$; $0<s<0.25$; $0<t<0.25$, with the provisos that $r+t=1$, and $s+t=1$, and $0.075<z<0.3$.

The compounds according to present invention, are especially suitable to convert some or all of said UV or near UV radiation into longer wavelength, preferably into the range of the VIS light.

In the context of the present application the term "UV radiation" has the meaning of electromagnetic radiation having a wavelength ranging from approximately 100 nm to approximately 280 nm, unless explicitly stated otherwise.

Additionally, the term "near UV radiation" has the meaning of electromagnetic radiation having a wavelength ranging from approximately 280 nm to approximately 400 nm, unless explicitly stated otherwise.

Moreover, the term "VIS light or VIS-light region" has the meaning of electromagnetic radiation having a wavelength ranging from approximately 400 nm to approximately 800 nm unless explicitly stated otherwise.

In the context of the present application, the term "conversion phosphor" and the term "phosphor" are used in the same manner.

Preferably, the compounds according to the present invention are typically excited by artificial or natural radiation sources in the near-UV spectral range, preferably about 280 to about 400 nm. Thus, the present invention relates also to the use of compounds of formula I as conversion phosphors, or short "phosphors".

Artificial "radiation sources" or "light sources" are preferably selected from black lights, short wave ultraviolet lamps, gas-discharge lamps, UV-LEDs, near UV LEDs or UV-lasers.

In the context of the present application, the term "natural radiation sources" means solar irradiation or sunlight.

It is preferred that the emissions spectra of the radiation sources and the absorption spectra of the compounds according to the present invention overlap more than 10 area percent, preferable more than 30 area percent, more preferable more than 60 area percent and most preferable more than 90 area percent.

The term "absorption" means the absorbance of a material, which corresponds to the logarithmic ratio of the radiation falling upon a material, to the radiation transmitted through a material.

The term "emission" means the emission of electromagnetic waves by electron transitions in atoms and molecules.

Preferably, the phosphors according to the present invention exhibit at least two emission peaks in the VIS light region, while being excited by UV or near UV light. Preferably, a first emission peak having its emission maximum preferably between about 400 nm and about 500 nm, more preferably between about 420 nm and about 480 nm, and a second emission peak having its emission maximum preferably in the range from approximately 550 nm to approximately 625 nm, more preferably from approximately 560 nm to approximately 600 nm.

In another preferred embodiment, the phosphors according to the present invention exhibit at least three emission peaks in the VIS light region, while being excited by UV or near UV light. A first emission peak having its emission maximum between about 400 nm and about 500 nm, more preferably between about 420 nm and about 480 nm, a second emission peak having its emission maximum in the range from approximately 550 nm to approximately 625 nm, more preferably from approximately 560 nm to approximately 600 nm, and a third emission peak having its emission maximum in the range from approximately 625 nm to approximately 790 nm more preferably from approximately 650 nm to approximately 720 nm, respectively.

The emission peaks of the compounds according to the present invention, preferably overlap each other. Preferably the overlap less than 90 area percent, more preferable less than 60 area percent even more preferable less than 30 area percent.

By varying the amount of Al in the compounds of the present invention, especially with regards to parameter z, the relative intensity of the emission peak having its emission maximum in the range of approximately 550 nm to approximately 625 nm, and the emission peak having its emission maximum in the range from approximately 625 nm to approximately 790 nm can be controlled.

Thus, it is possible to vary the emission color of the phosphor by varying the Al content. Generally, the higher the value of z, the higher is the intensity of emission peak having its main emission maximum in the range of approximately 550 nm to approximately 625 nm, and the lower is intensity of the emission peak having its main emission maximum in the range of approximately 625 nm to approximately 790 nm.

Thus, preferred compounds according to the present invention are preferably selected from compounds of the following sub formulae,

| | |
|---|---|
| $((Ca_rBa_r)_{0.8})(Mg_{0.75}Al_{0.05})(Si_{1.95}Al_{0.05})O_6:(Eu^{2+})_{0.2}(Mn^{2+})_{0.2}$ | Ia-2aa |
| $((Ca_rBa_r)_{0.8})(Mg_{0.7}Al_{0.1})(Si_{1.9}Al_{0.1})O_6:(Eu^{2+})_{0.2}(Mn^{2+})_{0.2}$ | Ia-2ab |
| $((Ca_rBa_r)_{0.8})(Mg_{0.65}Al_{0.15})(Si_{1.85}Al_{0.15})O_6:(Eu^{2+})_{0.2}(Mn^{2+})_{0.2}$ | Ia-2ac |
| $((Ca_rBa_r)_{0.8})(Mg_{0.6}Al_{0.2})(Si_{1.8}Al_{0.2})O_6:(Eu^{2+})_{0.2}(Mn^{2+})_{0.2}$ | Ia-2ad |
| $((Ca_rBa_r)_{0.8})(Mg_{0.55}Al_{0.25})(Si_{1.75}Al_{0.25})O_6:(Eu^{2+})_{0.2}(Mn^{2+})_{0.2}$ | Ia-2ae |
| $((Ca_rBa_r)_{0.8})(Mg_{0.5}Al_{0.3})(Si_{1.7}Al_{0.3})O_6:(Eu^{2+})_{0.2}(Mn^{2+})_{0.2}$ | Ia-2af |
| $((Sr_sCa_t)_{0.8})(Mg_{0.75}Al_{0.05})(Si_{1.95}Al_{0.05})O_6:(Eu^{2+})_{0.2}(Mn^{2+})_{0.2}$ | Ia-4aa |
| $((Sr_sCa_t)_{0.8})(Mg_{0.7}Al_{0.1})(Si_{1.9}Al_{0.1})O_6:(Eu^{2+})_{0.2}(Mn^{2+})_{0.2}$ | Ia-4ab |
| $((Sr_sCa_t)_{0.8})(Mg_{0.65}Al_{0.15})(Si_{1.85}Al_{0.15})O_6:(Eu^{2+})_{0.2}(Mn^{2+})_{0.2}$ | Ia-4ac |
| $((Sr_sCa_t)_{0.8})(Mg_{0.6}Al_{0.2})(Si_{1.8}Al_{0.2})O_6:(Eu^{2+})_{0.2}(Mn^{2+})_{0.2}$ | Ia-4ad |
| $((Sr_sCa_t)_{0.8})(Mg_{0.55}Al_{0.25})(Si_{1.75}Al_{0.25})O_6:(Eu^{2+})_{0.2}(Mn^{2+})_{0.2}$ | Ia-4ae |
| $((Sr_sCa_t)_{0.8})(Mg_{0.5}Al_{0.3})(Si_{1.7}Al_{0.3})O_6:(Eu^{2+})_{0.2}(Mn^{2+})_{0.2}$ | Ia-4af |
| $Ca_{0.8}(Mg_{0.75}Al_{0.05})(Si_{1.95}Al_{0.05})O_6:(Eu^{2+})_{0.2}(Mn^{2+})_{0.2}$ | Ia-7aa |
| $Ca_{0.8}(Mg_{0.7}Al_{0.1})(Si_{1.9}Al_{0.1})O_6:(Eu^{2+})_{0.2}(Mn^{2+})_{0.2}$ | Ia-7ab |
| $Ca_{0.8}(Mg_{0.65}Al_{0.15})(Si_{1.85}Al_{0.15})O_6:(Eu^{2+})_{0.2}(Mn^{2+})_{0.2}$ | Ia-7ac |

$Ca_{0.8}(Mg_{0.6}Al_{0.2})(Si_{1.8}Al_{0.2})O_6:(Eu^{2+})_{0.2}(Mn^{2+})_{0.2}$ \hfill Ia-7ad $Ca_{0.8}(Mg_{0.55}Al_{0.25})(Si_{1.75}Al_{0.25})O_6:(Eu^{2+})_{0.2}(Mn^{2+})_{0.2}$ \hfill Ia-7ae $Ca_{0.8}(Mg_{0.5}Al_{0.3})(Si_{1.7}Al_{0.3})O_6:(Eu^{2+})_{0.2}(Mn^{2+})_{0.2}$ \hfill Ia-7af wherein, $0<r<1$; $0<s<1$; $0<t<1$, preferably $0.75<r<1$; $0<s<0.25$; $0<t<0.25$, whereby $r+t=1$, and $s+t=1$.

The starting materials for the preparation of the compound according to the present invention are commercially available and suitable processes for the preparation of the compounds according to the present invention can be summarized in two general process classes. First, a solid-state diffusion process, and secondly, a wet-chemical process.

In the context of the present application, the term "solid state diffusion process" refers to any mixing and firing method or solid-phase method, comprising the steps of mixing oxides of Mg, Al, M and one or more salts comprising at least two elements selected from A, B or C at a predetermined molar ratio, optionally grinding the mixture, and calcining the powders in a furnace at temperatures up to 1500° C. for up to several days, optionally, under a reductive atmosphere (cf. Phosphor Handbook, second edition, CRC Press, 2006, 341-354).

In the context of the present application, the term "wet-chemical process" preferably comprises the following steps:
a) mixing a silicon-containing agent, a mixture of salts comprising at least the elements of Mg, Al, M and T and one or more salts comprising at least two elements selected from A, B or C at a predetermined molar ratio in a solvent;
b) adding a precipitation agent;
c) performing a primary heat treatment on the mixture, preferably in a temperature range of 800 to 1300° C. under an oxidative atmosphere; and
d) performing a secondary heat treatment on the mixture preferably in a temperature range of 800 to 1300° C. under a reductive atmosphere.

The above-mentioned heat treatment in step c) and/or d) is preferably carried out at a temperature above 1000° C., and more preferably in the range from 1100° C. to 1300° C.

The term "reductive atmosphere" means an atmosphere having reductive properties, preferably an atmosphere of carbon monoxide, forming gas or hydrogen or at least vacuum or an oxygen-deficient atmosphere, preferably in a stream of nitrogen, preferably in a stream of $N_2/H_2$ and particularly preferably in a stream of $N_2/H_2$ (95-80: 5-20).

The term "oxidative atmosphere" has the meaning of an atmosphere having oxidizing properties, preferably atmosphere of air or oxygen.

Step a) is preferably performed in a micro reactor, a small confined area of a flow channel with an internal diameter ranging from 1 mm to 10 mm width, wherein two or more solutions are mixed through said flow channel. In the micro reactor, chemical reactions of the mixed solutions take place in a confinement with typical lateral dimensions below a few millimeters.

The actual composition ratio of the phosphor can be confirmed by wavelength dispersive X-ray spectroscopy (WDX), and the results of WDX can be used to predetermine the molar ratio of the salt containing the elements Mg, Al, M, A, B and C for the mixing step a).

For the preparation of the mixture in step a), it is possible to prepare a mixture of some or all of the salts or components as powders and adding the solvent or to prepare the mixture stepwise directly in a solvent. However, the above-mentioned salts can be added to the mixture at anytime before the precipitation step (before step b).

The term "silicon containing agent" includes an inorganic silicon compound, preferably an oxide of silicon having the chemical formula $SiO_2$. It has a number of distinct crystalline forms (polymorphs) in addition to amorphous forms. The $SiO_2$ should be in small particles with a diameter of less than 1 μm; a diameter of less than 200 nm is even better. The "silicon containing agent" also refers to any organic silicon compounds, such as tetraalkyl ortho-silicates, alternately known as tetraalkoxy silanes, preferably tetraethoxysilane or tetramethoxysilane.

Suitable salts of the elements Mg, Al, M, A, B and C are preferably selected from corresponding nitrates, halogenides, hydrogensulfates or carbonates, more preferably nitrates or halogenides, and most preferably of halogenides, in particular chlorides.

The term "solvent" is taken to mean a solvent that does not necessarily dissolve the Si-compound. Water and alcohols, such as methanol, ethanol, etc. are preferred solvents in accordance with the present invention.

Preferred precipitation agents in step b) are preferably selected from sodium hydrogen carbonate, ammonium chloride, or ammonium hydrogen carbonate, more preferably the precipitation agent is ammonium chloride.

In a preferred embodiment of the invention, the precipitation agents are added in suitable solvents and preferably mixed with the solvents at temperatures above the melting point of the corresponding solvent and below the boiling point of the solvent. More preferably in a temperature range up to about 70° C., even more preferably up to about 60° C., and preferably for at least 1 h or more, more preferably for at least 2 hours or more.

In a preferred embodiment of the present invention, a pre-heat treatment step can optionally be performed after performing step b) and before performing step c), in order to evaporate the solvent from the mixture of step b). As commonly known by the expert, suitable temperature conditions depends mainly on the used solvent. However, preferred temperature conditions range up to 100° C., more preferably up to 90° C. and even more preferably up to 80° C.

A suitable evaporation atmosphere is not particularly limited to any particular conditions regarding pressure or atmosphere. However, preferably, the evaporation of the solvent is performed under an air atmosphere but also applying reduced pressure conditions is applicable in the sense of the present application.

As to step c), an annealing oven, as known to the expert, is preferably driven under an oxidative atmosphere (such as oxygen or air or oxygen-containing atmosphere). In a further preferred embodiment of the invention, a commonly known oxidation furnace is used in the step c).

As to step d), an annealing oven, as known to the expert, is preferably driven under a reductive atmosphere (such as carbon monoxide, pure hydrogen, vacuum, or an oxygen-deficient atmosphere). In a further preferred embodiment of the invention, a commonly known reducing furnace is used in the step d).

The particle size of the phosphors according to the invention is typically between 50 nm and 30 μm, preferably between 1 μm and 20 μm.

In a further preferred embodiment, the phosphors in particle form have a continuous surface coating consisting of $SiO_2$, $TiO_2$, $Al_2O_3$, ZnO, $ZrO_2$ and/or $Y_2O_3$ or mixed oxides thereof. This surface coating has the advantage that, through a suitable grading of the refractive indices of the coating materials, the refractive index can be matched to the environment. In this case, the scattering of light at the surface of the phosphor is reduced and a greater proportion of the light can penetrate into the phosphor and be absorbed and converted therein. In addition, the refractive index-matched surface coating enables more light to be coupled out of the phosphor since total internal reflection is reduced.

In addition, a continuous layer is advantageous if the phosphor has to be encapsulated. This may be necessary in order to counter sensitivity of the phosphor or parts thereof to diffusing water or other materials in the immediate environment. A further reason for encapsulation with a closed shell is thermal decoupling of the actual phosphor from the heat generated in the chip. This heat results in a reduction in the fluorescence light yield of the phosphor and may also influence the colour of the fluorescence light.

Finally, a coating of this type enables the efficiency of the phosphor to be increased by preventing lattice vibrations arising in the phosphor from propagating to the environment.

In addition, it is preferred for the phosphors to have a porous surface coating consisting of $SiO_2$, $TiO_2$, $Al_2O_3$, ZnO, $ZrO_2$ and/or $Y_2O_3$ or mixed oxides thereof or of the phosphor composition. These porous coatings offer the possibility of further reducing the refractive index of a single layer. Porous coatings of this type can be produced by three conventional methods, as described in WO 03/027015, which is incorporated in its full scope into the context of the present application by way of reference: the etching of glass (for example soda-lime glasses (see U.S. Pat. No. 4,019, 884)), the application of a porous layer, and the combination of a porous layer and an etching operation.

In a further preferred embodiment, the phosphor particles have a surface which carries functional groups which facilitate chemical bonding to the environment, preferably consisting of epoxy or silicone resin. These functional groups can be, for example, esters or other derivatives which are bonded via oxo groups and are able to form links to constituents of the binders based on epoxides and/or silicones. Surfaces of this type have the advantage that homogeneous incorporation of the phosphors into the binder is facilitated. Furthermore, the rheological properties of the phosphor/binder system and also the pot lives can thereby be adjusted to a certain extent. Processing of the mixtures is thus simplified.

Since the phosphor layer according to the invention applied to the LED chip preferably consists of a mixture of silicone and homogeneous phosphor particles which is applied by bulk casting, and the silicone has a surface tension, this phosphor layer is not uniform at a microscopic level or the thickness of the layer is not constant throughout. This is generally also the case if the phosphor is not applied by the bulk-casting process, but instead in the so-called chip-level conversion process, in which a highly concentrated, thin phosphor layer is applied directly to the surface of the chip with the aid of electrostatic methods.

With the aid of the above-mentioned process, it is possible to produce any desired outer shapes of the phosphor particles, such as spherical particles, flakes and structured materials and ceramics.

The preparation of flake-form phosphors as a further preferred embodiment is carried out by conventional processes from the corresponding metal salts and/or rare-earth salts. The preparation process is described in detail in EP 763573 and DE 102006054331, which are incorporated in their full scope into the context of the present application by way of reference. These flake-form phosphors can be prepared by coating a natural or synthetically prepared, highly stable support or a substrate comprising, for example, mica, $SiO_2$, $Al_2O_3$, $ZrO_2$, glass or $TiO_2$ flakes which has a very large aspect ratio, an atomically smooth surface and an adjustable thickness with a phosphor layer by a precipitation reaction in aqueous dispersion or suspension. Besides mica, $ZrO_2$, $SiO_2$, $Al_2O_3$, glass or $TiO_2$ or mixtures thereof, the flakes may also consist of the phosphor material itself or be built up from one material. If the flake itself merely serves as support for the phosphor coating, the latter must consist of a material which is transparent to the primary radiation of the LED, or absorbs the primary radiation and transfers this energy to the phosphor layer. The flake-form phosphors are dispersed in a resin (for example silicone or epoxy resin), and this dispersion is applied to the LED chip. The flake-form phosphors can be prepared on a large industrial scale in thicknesses of 50 nm to about 20 μm, preferably between 150 nm and 5 μm. The diameter here is 50 nm to 20 μm.

It generally has an aspect ratio (ratio of the diameter to the particle thickness) of 1:1 to 400:1 and in particular 3:1 to 100:1.

The flake dimensions (length×width) are dependent on the arrangement. Flakes are also suitable as centres of scattering within the conversion layer, in particular if they have particularly small dimensions.

The surface of the flake-form phosphor according to the invention facing the LED chip can be provided with a coating which has an antireflection action with respect to the primary radiation emitted by the LED chip. This results in a reduction in back-scattering of the primary radiation, enabling the latter to be coupled better into the phosphor body according to the invention.

Suitable for this purpose are, for example, coatings of matched refractive index, which must have a following thickness d: d=[wavelength of the primary radiation of the LED chip/(4*refractive index of the phosphor ceramic)], see, for example, Gerthsen, Physik [Physics], Springer Verlag, 18th Edition, 1995. This coating may also consist of photonic crystals, which also includes structuring of the surface of the flake-form phosphor in order to achieve certain functionalities.

The production of the phosphors according to the invention in the form of ceramic bodies is carried out analogously to the process described in DE 102006037730 (Merck), which is incorporated in its full scope into the context of the present application by way of reference. In this process, the phosphor is prepared by wet-chemical methods by mixing the corresponding starting materials and dopants, subsequently subjected to isostatic pressing and applied directly to the surface of the chip in the form of a homogeneous, thin and non-porous flake. There is thus no location-dependent variation of the excitation and emission of the phosphor, which means that the LED provided therewith emits a homogeneous light cone of constant colour and has high light output. The ceramic phosphor bodies can be produced on a large industrial scale, for example, as flakes in thicknesses of a few 100 nm to about 500 μm. The flake dimensions (length×width) are dependent on the arrangement. In the case of direct application to the chip, the size of the flake should be selected in accordance with the chip dimensions (from about 100 μm*100 μm to several mm²) with a certain oversize of about 10% to 30% of the chip surface with a suitable chip arrangement (for example flip-chip arrangement) or correspondingly. If the phosphor flake is installed over a finished LED, the entire exiting light cone passes through the flake.

The side surfaces of the ceramic phosphor body can be coated with a light metal or noble metal, preferably aluminium or silver. The metal coating has the effect that light does not exit laterally from the phosphor body. Light exiting laterally can reduce the luminous flux to be coupled out of the LED. The metal coating of the ceramic phosphor body is carried out in a process step after the isostatic pressing to give rods or flakes, where the rods or flakes can optionally be cut to the requisite size before the metal coating. To this end, the side surfaces are wetted, for example, with a solution comprising silver nitrate and glucose and subsequently exposed to an ammonia atmosphere at elevated temperature. A silver coating, for example, forms on the side surfaces in the process.

Alternatively, current less metallisation processes are also suitable, see, for example, Hollemann-Wiberg, Lehrbuch der Anorganischen Chemie [Textbook of Inorganic Chemistry], Walter de Gruyter Verlag or Ullmanns Enzyklopädie der chemischen Technologie [Ullmann's Encyclopaedia of Chemical Technology].

The ceramic phosphor body can, if necessary, be fixed to the baseboard of an LED chip using a water-glass solution.

In a further embodiment, the ceramic phosphor body has a structured (for example pyramidal) surface on the side opposite an LED chip. This enables as much light as possible to be coupled out of the phosphor body. The structured surface on the phosphor body is produced by carrying out the isostatic pressing using a compression mould having a structured pressure plate and thus embossing a structure into the surface. Structured surfaces are desired if the aim is to produce the thinnest possible phosphor bodies or flakes. The pressing conditions are known to the person skilled in the art (see J. Kriegsmann, Technische keramische Werkstoffe [Industrial Ceramic Materials], Chapter 4, Deutscher Wirtschaftsdienst, 1998). It is important that the pressing temperatures used are ⅔ to ⅚ of the melting point of the substance to be pressed.

The compounds according to the present invention exhibit high thermal quenching resistivity.

The term "thermal quenching resistivity" means an emission intensity decrease at higher temperature compared to an original intensity at 25° C.

The compounds according to the present invention exhibit an high chemical stability against humidity or moisture with regards to decomposition.

The compounds according to the present invention preferably exhibit a quantum efficiency of at least 80% and more preferably of at least 90%.

The compounds of the present invention are of good LED quality. In the context of this application, the LED quality is determined by commonly known parameters, such as the color rendering index (CRI), the Correlated Color Temperature (CCT), the lumen equivalent or absolute lumen, and the color point in CIE x and y coordinates.

The Color Rendering Index (CRI), as known to the expert, is a unit less photometric size, which compares the color fidelity of an artificial light source to that of sunlight or filament light sources (the latter two have a CRI of 100).

The Correlated Color Temperature (CCT), as known to the expert, is a photometric variable having the unit Kelvin. The higher the number, the greater the blue component of the light and the colder the white light of an artificial light source appears to the viewer. The CCT follows the concept of the black light blue lamp, which color temperature describes the so-called Planck's curve in the CIE diagram.

The lumen equivalent, as known to the expert, is a photometric variable having the unit the lm/W. The lumen equivalent describes the size of the photometric luminous flux of a light source at a specific radiometric radiation power having the unit is watts. The higher the lumen equivalent is, the more efficient is a light source.

The lumen, as known to the expert, is photometric variable, which describes the luminous flux of a light source, which is a measure of the total radiation emitted by a light source in the VIS region. The greater the light output, the brighter the light source appears to the observer.

CIE x and CIE y are the coordinates of the CIE chromaticity diagram (here 1931 standard observer), which describes the color of a light source.

All of the above variables can be calculated from the emission spectra of the light source by methods known to the expert.

The phosphors according to the present invention can be used as obtained or in a mixture with other phosphors. Therefore, the present invention also relates phosphor mixtures comprising at least one compound according to the present invention.

Suitable phosphors for a mixture according to the present invention are for example:
$Ba_2SiO_4:Eu^{2+}$, $BaSi_2O_5:Pb^{2+}$, $Ba_xSr_{1-x}F_2:Eu^{2+}$, $BaSrMgSi_2O_7:Eu^{2+}$, $BaTiP_2O_7$, $(Ba,Ti)_2P_2O_7:Ti$, $Ba_3WO_6:U$, $BaY_2F_8:Er^{3+}$, $Yb^+$, $Be_2SiO_4:Mn^{2+}$, $Bi_4Ge_3O_{12}$, $CaAl_2O_4:Ce^{3+}$, $CaLa_2O_7:Ce^{3+}$, $CaAl_2O_4:Eu^{2+}$, $CaAl_2O_4:Mn^{2+}$, $CaAl_4O_7:Pb^{2+}$, $Mn^2$, $CaAl_2O_4:Tb^{3+}$, $Ca_3Al_2Si_3O_{12}:Ce^{3+}$, $Ca_3Al_2Si_3O_{12}:Ce^{3+}$, $Ca_3Al_2Si_3O_{12}:Eu^{2+}$, $Ca_2B_5O_9Br:Eu^{2+}$, $Ca_2B_5O_9Cl:Eu^{2+}$, $Ca_2B_5O_9Cl:Pb^{2+}$, $CaB_2O_4:Mn^{2+}$, $Ca_2B_2O_5:Mn^{2+}CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+}$, $Mn^{2+}$, $Ca_2Ba_3(PO_4)_3Cl:Eu^{2+}$, $CaBr_2:Eu^2$ in $SiO_2$, $CaCl_2:Eu^2$ in $SiO_2$, $CaCl_2:Eu^{2+}$, $Mn^2$ in $SiO_2$, $CaF_2:Ce^{3+}$, $CaF_2:Ce^{3+}$, $Mn^{2+}$, $CaF_2:Ce^{3+}$, $Tb^{3+}$, $CaF_2:Eu^{2+}$, $CaF_2:Mn^{2+}$, $CaF_2:U$, $CaGa_2O_4:Mn^{2+}$, $CaGa_4O_7:Mn^{2+}$, $CaGa_2S_4:Ce^{3+}$, $CaGa_2S_4:Eu^{2+}$, $CaGa_2S_4:Mn^{2+}$, $CaGa_2S_4:Pb^{2+}$, $CaGeO_3:Mn^{2+}$, $CaI_2:Eu^2$ in $SiO_2$, $CaI_2:Eu^{2+}$, $Mn^{2+}$ in $SiO_2$, $CaLaBO_4:Eu^{3+}$, $CaLaB_3O_7:Ce^{3+}$, $Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O_8:Eu^{2+}$, $Ca_2MgSi_2O_7:Eu^{2+}$, $CaMgSi_2O_6:Eu^{2+}$, $Mn^{2+}$, $Ca_2MgSi_2O_7:Eu^{2+}$, $Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+}$, $Na^+$, $CaO:Mn^{2+}$, $CaO:Pb^{2+}$, $CaO:Sb^{3+}$, $CaO:Sm^{3+}$, $CaO:Tb^{3+}$, $CaO:Tl$, $CaO:Zn^{2+}$, $Ca_2P_2O_7:Ce^{3+}$, $\alpha-Ca_3(PO_4)_2:Ce^{3+}$, $\beta-Ca_3(PO_4)_2:Ce^{3+}$, $Ca_5(PO_4)_3Cl:Eu^{2+}$, $Ca_5(PO_4)_3Cl:Mn^{2+}$, $Ca_5(PO_4)_3Cl:Sb^{3+}$, $Ca_5(PO_4)_3Cl:Sn^{2+}$, $\beta-Ca_3(PO_4)_2:Eu^{2+}$, $Mn^{2+}$, $Ca_5(PO_4)_3F:Mn^{2+}$, $Ca_5(PO_4)_3F:Sb^{3+}$, $Ca_5(PO_4)_3F:Sn^{2+}$, $\alpha-Ca_3(PO_4)_2:Eu^{2+}$, $\beta-Ca_3(PO_4)_2:Eu^{2+}$, $Ca_2P_2O_7:Eu^{2+}$, $Ca_2P_2O_7:Eu^{2+}$, $Mn^{2+}$, $CaP_2O_6:Mn^{2+}$, $\alpha-Ca_3(PO_4)_2:Pb^{2+}$, $\alpha-Ca_3(PO_4)_2:Sn^{2+}$, $\beta-Ca_3(PO_4)_2:Sn^{2+}$, $\beta-Ca_2P_2O_7:Sn$, $Mn$, $\alpha-Ca_3(PO_4)_2:Tr$, $CaS:Bi^{3+}$, $CaS:Bi^{3+}$, $Na$, $CaS:Ce^{3+}$, $CaS:Eu^{2+}$, $CaS:Cu^+$, $Na^+$, $CaS:La^{3+}$, $CaS:Mn^{2+}$, $CaSO_4:Bi$, $CaSO_4:Ce^{3+}$, $CaSO_4:Ce^{3+}$, $Mn^{2+}$, $CaSO_4:Eu^{2+}$, $CaSO_4:Eu^{2+}$, $Mn^{2+}$, $CaSO_4:Pb^{2+}$, $CaS:Pb^{2+}$, $CaS:Pb^{2+}$, $Cl$, $CaS:Pb^{2+}$, $Mn^{2+}$, $CaS:Pr^{3+}$, $Pb^{2+}$, $Cl$, $CaS:Sb^{3+}$, $CaS:Sb^{3+}$, $Na$, $CaS:Sm^{3+}$, $CaS:Sn^{2+}$, $CaS:Sn^{2+}$, $F$, $CaS:Tb^{3+}$, $CaS:Tb^{3+}$, $Cl$, $CaS:Y^{3+}$, $CaS:Yb^{2+}$, $CaS:Yb^{2+}$, $Cl$, $CaSiO_3:Ce^{3+}$, $Ca_3SiO_4Cl_2:Eu^{2+}$, $Ca_3SiO_4Cl_2:Pb^{2+}$, $CaSiO_3:Eu^{2+}$, $CaSiO_3:Mn^{2+}$, $Pb$, $CaSiO_3:Pb^{2+}$, $CaSiO_3:Pb^{2+}$, $Mn^{2+}$, $CaSiO_3:Ti^{4+}$, $CaSr_2(PO_4)_2:Bi^{3+}$, $\beta-(Ca,Sr)_3(PO_4)_2:Sn^{2+}Mn^{2+}$, $CaTi_{0.9}Al_{0.1}O_3:Bi^{3+}$, $CaTiO_3:Eu^{3+}$, $CaTiO_3:Pr^{3+}$, $Ca_5(VO_4)_3Cl$, $CaWO_4$, $CaWO_4:Pb^{2+}$, $CaWO_4:W$, $Ca_3WO_6:U$, $CaYAlO_4:Eu^{3+}$, $CaYBO_4:Bi^{3+}$, $CaYBO_4:Eu^{3+}$, $CaYB_{0.8}O_{3.7}:Eu^{3+}$, $CaY_2ZrO_6:Eu^{3+}$, $(Ca,Zn,Mg)_3(PO_4)_2:Sn$, $CeF_3$, $(Ce,Mg)BaAl_{11}O_{18}:Ce$, $(Ce,Mg)SrAl_{11}O_{18}:Ce$, $CeMgAl_{11}O_{19}:Ce:Tb$, $Cd_2B_6O_{11}:Mn^{2+}$, $CdS:Ag^+$, $Cr$, $CdS:In$, $CdS:In$, $CdS:In$, $Te$, $CdS:Te$, $CdWO_4$, $CsF$, $CsI$, $CsI:Na^+$, $CsI:Tl$, $(ErCl_3)_{0.25}(BaCl_2)_{0.75}$, $GaN:Zn$, $Gd_3Ga_5O_{12}:Cr^{3+}$, $Gd_3Ga_5O_{12}:Cr$, $Ce$, $GdNbO_4:Bi^{3+}$, $Gd_2O_2S:Eu^{3+}$, $Gd_2O_2Pr^{3+}$, $Gd_2O_2S:Pr$, $Ce$, $F$, $Gd_2O_2S:Tb^{3+}$, $Gd_2SiO_5:Ce^{3+}$, $KAl_{11}O_{17}:Tl^+$, $KGa_{11}O_{17}:Mn^{2+}$, $K_2La_2Ti_3O_{10}:Eu$, $KMgF_3:Eu^{2+}$, $KMgF_3:Mn^{2+}$, $K_2SiF_6:Mn^{4+}$, $LaAl_3B_4O_{12}:Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, (La, Ce, Tb) $PO_4:Ce:Tb$, $LaCl_3:Ce^{3+}$, $La_2O_3:Bi^{3+}$, $LaOBr:Tb^{3+}$, $LaOBr:Tm^{3+}$, $LaOCl:Bi^{3+}$, $LaOCl:Eu^{3+}$, $LaOF:Eu^{3+}$, $La_2O_3:Eu^{3+}$, $La_2O_3:Pr^{3+}$, $La_2O_2S:Tb^{3+}$, $LaPO_4:Ce^{3+}$, $LaPO_4:Eu^{3+}$, $LaSiO_3Cl:Ce^{3+}$, $LaSiO_3Cl:Ce^{3+}$, $Tb^{3+}$, $LaVO_4:Eu^{3+}$, $La_2W_3O_{12}:Eu^{3+}$, $LiAlF_4:Mn^{2+}$, $LiAl_5O_8:Fe^{3+}$, $LiAlO_2:Fe^{3+}$, $LiAlO_2:Mn^{2+}$, $LiAl_5O_8:Mn^{2+}$, $Li_2CaP_2O_7:Ce^{3+}$, $Mn^{2+}$, $LiCeBa_4Si_4O_{14}:Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, (Lu, Gd)$_2SiO_5:Ce^{3+}$, $Lu_2SiO_5:Ce^{3+}$, $Lu_2Si_2O_7:Ce^{3+}$, $LuTaO_4:Nb^{5+}$, $Lu_{1-x}Y_xAlO_3:Ce^{3+}$, $MgAl_2O_4:Mn^{2+}$, $MgSrAl_{10}O_{17}:Ce$, $MgB_2O_4:Mn^{2+}$, $MgBa_2(PO_4)_2:Sn^{2+}$, $MgBa_2(PO_4)_2:U$, $MgBaP_2O_7:Eu^{2+}$, $MgBaP_2O_7:Eu^{2+}$, $Mn^{2+}$, $MgBa_3Si_2O_8:Eu^{2+}$, $MgBa(SO_4)_2:Eu^{2+}$, $Mg_3Ca(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+}$, $Mn^2$, $MgCeAl_nO_{19}:Tb^{3+}$, $Mg_4(F)GeO_6:Mn^{2+}$, $Mg_4(F)(Ge, Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3:Mn^{2+}$, $Mg_2SiO_4:Mn^{2+}$, $Mg_3SiO_3F_4:Ti^{4+}$, $MgSO_4:Eu^{2+}MgSO_4:Pb^{2+}$, $MgSrBa_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+}$, $Mn^{2+}$, $Mg_2Sr(SO_4)_3:Eu^{2+}$, $Mg_2TiO_4:Mn^{4+}$, $MgWO_4$, $MgYBO_4:Eu^{3+}$, $Na_3Ce(PO_4)_2:Tb^{3+}$, $NaI$, $Tl$, $Na_{1-23}K_{O-42}Eu_{0-12}TiSi_4O_{11}:Eu^{3+}$, $Na_{1.23}K_{0.42}Eu_{0.12}TiSi_5O_{13}.xH_2O:Eu^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_{2-x}Mn_x)LiSi_4O_{10}F_2:Mn$, $NaYF_4:Er^{3+}$, $Yb^{3+}$, $NaYO_2:Eu^{3+}$, $SrAl_{12}O_{19}:Ce^{3+}$, $Mn^{2+}$, $SrAl_2O_4:Eu^{2+}$, $SrAl_4O_7:Eu^{3+}$, $SrAl_{12}O_{19}:Eu^{2+}$, $SrAl_2S_4:Eu^{2+}$, $Sr_2B_5O_9Cl:Eu^{2+}$, $SrB_4O_7:Eu^{2+}(F, Cl, Br)$, $SrB_4O_7:Pb^{2+}$, $SrB_4O_7:Pb^{2+}$, $Mn^{2+}$, $SrB_8O_{13}:Sm^{2+}$, $Sr_xBa_yCl_zAl_2O_{4-z/2}:Mn^{2+}$, $Ce^{3+}$, $SrBaSiO_4:Eu^{2+}$, $Sr(Cl, Br, I)_2:Eu^{2+}$ in $SiO_2$, $SrCl_2:Eu^{2+}$ in $SiO_2$, $Sr_5Cl(PO_4)_3:Eu$, $Sr_wF_xB_4O_{6.5}:Eu^{2+}$, $Sr_wF_xB_yO_z:Eu^{2+}$, $Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $SrGa_2S_4:Pb^{2+}$, $SrIn_2O_4:Pr^{3+}$, $Al^{3+}$, (Sr, Mg)$_3(PO_4)_2:Sn$, $SrMgSi_2O_6:Eu^{2+}$, $Sr_2MgSi_2O_7:Eu^{2+}$, $Sr_3MgSi_2O_8:Eu^{2+}$, $SrMoO_4:U$, $SrO.3B_2O_3:Eu^{2+}$, $Cl$, $ß-SrO.3B_2O_3:Pb^{2+}$, $ß-SrO.3B_2O_3:Pb^{2+}$, $Mn^{2+}$, $α-SrO.3B_2O_3:Sm^{2+}$, $Sr_6P_5BO_{20}:Eu$, $Sr_5(PO_4)_3Cl:Eu^{2+}$, $Sr_5(PO_4)_3Cl:Eu^{2+}$, $Pr^{3+}$, $Sr_5(PO_{43}Cl:Mn^{2+}$, $Sr_5(PO_4)_3Cl:Sb^{3+}$, $Sr_2P_2O_7:Eu^{2+}$, $β-Sr_3(PO_4)_2:Eu^{2+}$, $Sr_5(PO_4)_3F:Mn^{2+}$, $Sr_5(PO_4)_3F:Sb^{3+}$, $Sr_5(PO_4)_3F:Sb^{3+}$, $Mn^{2+}$, $Sr_5(PO_4)_3F:Sn^{2+}$, $Sr_2P_2O_7:Sn^{2+}$, $β-Sr_3(PO_4)_2:Sn^{2+}$, $β-Sr_3(PO_4)_2:Sn^{2+}$, $Mn^{2+}$ (Al), $SrS:Ce^{3+}$, $SrS:Eu^{2+}$, $SrS:Mn^{2+}$, $SrS:Cu^+$, $Na$, $SrSO_4:Bi$, $SrSO_4:Ce^{3+}$, $SrSO_4:Eu^{2+}$, $SrSO_4:Eu^{2+}$, $Mn^{2+}$, $Sr_5Si_4O_{10}Cl_6:Eu^{2+}$, $Sr_2SiO_4:Eu^{2+}$, $SrTiO_3:Pr^{3+}$, $SrTiO_3:Pr^{3+}$, $Al^{3+}$, $Sr_3WO_6:U$, $SrY_2O_3:Eu^{3+}$, $ThO_2:Eu^{3+}$, $ThO_2:Pr^{3+}$, $ThO_2:Tb^{3+}$, $YAl_3B_4O_{12}:Bi^{3+}$, $YAl_3B_4O_{12}:Ce^{3+}$, $YAl_3B_4O_{12}:Ce^{3+}$, $Mn$, $YAl_3B_4O_{12}:Ce^{3+}$, $Tb^{3+}$, $YAl_3B_4O_{12}:Eu^{3+}$, $YAl_3B_4O_{12}:Eu^{3+}$, $Cr^{3+}$, $YAl_3B_4O_{12}:Th^{4+}$, $Ce^{3+}$, $Mn^{2+}$, $YAlO_3:Ce^{3+}$, $Y_3Al_5O_{12}:Ce^{3+}$, $Y_3Al_5O_{12}:Cr^{3+}$, $YAlO_3:Eu^{3+}$, $Y_3Al_5O_{12}:Eu^{3+}$, $Y_4Al_2O_9:Eu^{3+}$, $Y_3Al_5O_{12}:Mn^{4+}$, $YAlO_3:Sm^{3+}$, $YAlO_3:Tb^{3+}$, $Y_3Al_5O_{12}:Tb^{3+}$, $YAsO_4:Eu^{3+}$, $YBO_3:Ce^{3+}$, $YBO_3:Eu^{3+}$, $YF_3:Er^{3+}$, $Yb^{3+}$, $YF_3:Mn^{2+}$, $YF_3:Mn^{2+}$, $Th^{4+}$, $YF_3:Tm^{3+}$, $Yb^{3+}$, (Y, Gd)$BO_3:Eu$, (Y, Gd)$BO_3:Tb$, (Y, Gd)$_2O_3:Eu^{3+}$, $Y_{1.34}Gd_{0.603}(Eu, Pr)$, $Y_2O_3:Bi^{3+}$, $YOBr:Eu^{3+}$, $Y_2O_3:Ce$, $Y_2O_3:Er^{3+}$, $Y_2O_3:Eu^{3+}(YOE)$, $Y_2O_3:Ce^{3+}$, $Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S:Eu^{3+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+}$, $Tb^{3+}$, $YPO_4:Eu^{3+}$, $YPO_4:Mn^{2+}$, $Th^{4+}$, $YPO_4:V^{5+}$, $Y(P,V)O_4:Eu$, $Y_2SiO_5:Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, (Zn, Be)$_2SiO_4:Mn^{2+}$, $Zn_{0.4}Cd_{0.6}S:Ag$, $Zn_{0.6}Cd_{0.4}S:Ag$, (Zn, Cd)$S:Ag$, Cl, (Zn, Cd)$S:Cu$, $ZnF_2:Mn^{2+}$, $ZnGa_2O_4$, $ZnGa_2O_4:Mn^{2+}$, $ZnGa_2S_4:Mn^{2+}$, $Zn_2GeO_4:Mn^{2+}$, (Zn, Mg)$F_2:Mn^{2+}$, $ZnMg_2(PO_4)_2:Mn^{2+}$, (Zn, Mg)$_3(PO_4)_2:Mn^{2+}$, $ZnO:Al^{3+}$, $Ga^{3+}$, $ZnO:Bi^{3+}$, $ZnO:Ga^{3+}$, $ZnO:Ga$, $ZnO$—$CdO:Ga$, $ZnO:S$, $ZnO:Se$, $ZnO:Zn$, $ZnS:Ag^+$, $Cl^-$, $ZnS:Ag$, $Cu$, $Cl$, $ZnS:Ag$, $Ni$, $ZnS:Au$, $In$, $ZnS$—$CdS$ (25-75), $ZnS$—$CdS$ (50-50), $ZnS$—$CdS$ (75-25), $ZnS$—$CdS:Ag$, $Br$, $Ni$, $ZnS$—$CdS:Ag^+$, $Cl$, $ZnS$—$CdS:Cu$, $Br$, $ZnS$—$CdS:Cu$, $I$, $ZnS:Cl^-$, $ZnS:Eu^{2+}$, $ZnS:Cu$, $ZnS:Cu^+$, $Al^{3+}$, $ZnS:Cu^+$, $Cl^-$, $ZnS:Cu$, $Sn$, $ZnS:Eu^{2+}$, $ZnS:Mn^{2+}$, $ZnS:Mn$, $Cu$, $ZnS:Mn^{2+}$, $Te^{2+}$, $ZnS:P$, $ZnS:P^{3-}$, $Cl^-$, $ZnS:Pb^{2+}$, $ZnS:Pb^{2+}$, $Cl^-$, $ZnS:Pb$, $Cu$, $Zn_3(PO_4)_2:Mn^{2+}$, $Zn_2SiO_4:Mn^{2+}$, $Zn_2SiO_4:Mn^{2+}$, $As^{5+}$, $Zn_2SiO_4:Mn$, $Sb_2O_2$, $Zn_2SiO_4:Mn^{2+}$, $P$, $Zn_2SiO_4:Ti^{4+}$, $ZnS:Sn^{2+}$, $ZnS:Sn$, $Ag$, $ZnS:Sn^{2+}$, $Li^+$, $ZnS:Te$, $Mn$, $ZnS$—$ZnTe:Mn^{2+}$, $ZnSe:Cu^+$, $Cl$ and $ZnWO_4$.

As mentioned above, the phosphors according to the present invention can be excited over a broad range, extending from about 280 nm to 400 nm, preferably 300 nm to about 400 nm.

Accordingly, the present invention also relates to the use of at least one compound according to the present invention as a conversion phosphor for the conversion of all or some of the UV or near-UV radiation emitted by an suitable light source.

Thus, the present invention also relates to an illumination unit, which comprises at least one light source with an emission maximum in the range of 280 nm to 400 nm, and all or some of this radiation is converted into longer-wavelength radiation by a compound according to the present invention or a corresponding phosphor mixture as described above and below.

Preferably, the illumination unit comprises an UV or near UV LED and at least one phosphor according to the present invention. Such illumination unit is preferably white-light-emitting, in particular having a colour coordinate of x=0.12-0.43 and y=0.07-0.43, more preferably x=0.15-0.33 and y=0.10-0.33, Preference is furthermore given to an illumination unit, in particular for general lighting, which is characterised in that it has a CRI >60, preferably >70, more preferably >80.

In another embodiment, the illumination unit emits light having a certain colour point (colour-on-demand principle). The colour-on-demand concept is taken to mean the production of light having a certain colour point using a pcLED (=phosphor-converted LED) using one or more phosphors. This concept is used, for example, in order to produce certain corporate designs, for example for illuminated company logos, trademarks, etc.

Especially for the purpose that certain colour spaces should be established, the phosphor is preferably mixed with at least one further phosphor selected from the group of oxides, molybdates, tungstates, vanadates, garnets, silicates, aluminates, nitrides and oxynitrides, in each case individually or mixtures thereof with one or more activator ions, such as Ce, Eu, Mn, Cr and/or Bi.

Suitable green emitting phosphors, are preferably selected from Ce-doped lutetium-containing garnets, Eu-doped sulfoselenides, thiogallates, $BaMgAl_{10}O_{17}:EuMn$ (BAM:EuMn), $SrGa_2S_4:Eu$ and/or Ce- and/or Eu-doped nitride containing phosphors and/or β-SiAlON:Eu.

Suitable blue-emitting phosphor, are preferably selected from BAM: Eu or $Sr_{10}(PO_4)_6Cl_2:Eu$.

Suitable phosphors emitting yellow light, can preferably selected from garnet phosphors (e.g., $(YTbGd)_3Al_5O_{12}:Ce$), ortho-silicates phosphors (e.g., $(CaSrBa)_2SiO_4:Eu$), or Sialon-phosphors (e.g., α-SiAlON: Eu).

The term "blue-emitting phosphor" refers to a phosphor emitting a wavelength having at least one emission maximum between 435 nm and 507 nm.

The term "green emitting phosphor" refers to a phosphor emitting a wavelength having at least one emission maximum between 508 nm and 550 nm.

The term "yellow emitting phosphor" or refers to a phosphor emitting a wavelength having at least one emission maximum between 551 nm and 585 nm.

The term "red-emitting phosphor" refers to a phosphor emitting a wavelength having at least one emission maximum between 586 and 670 nm.

In a preferred embodiment, the illumination unit according to the invention comprises a light source, which is a luminescent indium aluminium gallium nitride, in particular of the formula $In_iGa_jAl_kN$, where $0 \leq i, 0 \leq j, 0 \leq k$, and $i+j+k=1$.

In a another preferred embodiment of the illumination unit according to the invention, the light source is a luminescent arrangement based on ZnO, TCO (transparent conducting oxide), ZnSe or SiC or an arrangement based on an organic light-emitting layer (OLED).

In a further preferred embodiment of the illumination unit according to the invention, the light source is a source which exhibits electroluminescence and/or photoluminescence. The light source may furthermore also be a plasma or discharge source. Possible forms of light sources of this type are known to the person skilled in the art. These can be light-emitting LED chips of various structures.

The phosphors according to the invention can either be dispersed in a resin (for example epoxy or silicone resin) or, in the case of suitable size ratios, arranged directly on the light source or alternatively arranged remote there from, depending on the application (the latter arrangement also includes "remote phosphor technology"). The advantages of remote phosphor technology are known to the person skilled in the art and are revealed, for example, by the following publication: Japanese Journal of Appl. Phys. Vol. 44, No. 21 (2005). L649-L651.

Compounds according to the present invention are also suitable for converting parts of solar irradiation radiation having a wavelength of less than approximately 400 nm into radiation of a wavelength of more than approximately 400 nm, which can be utilized more effectively by a variety of semiconductor materials in solar cells.

Therefore, the present invention also relates to the use of at least one compound according to the invention as a wavelength conversion material for solar cells.

Thus, the invention relates also to a method of improvement of a solar cell module by applying e.g. a polymer film comprising a phosphor according to the present invention, which is capable to increase the light utilization efficiency and the power-generating efficiency, due to a wavelength conversion of the shortwave part of the solar irradiation spectrum which normally cannot be utilized due to the absorption characteristics of the semiconductor material in the solar cell module.

The present invention is described above and below with particular reference to the preferred embodiments. It should be understood that various changes and modifications might be made therein, without departing from the spirit and scope of the invention.

Many of the compounds or mixtures thereof, mentioned above and below, are commercially available. The organic compounds are either known or can be prepared by methods which are known per se, as described in the literature (for example in the standard works such as Houben-Weyl, Methoden der Organischen Chemie [Methods of Organic Chemistry], Georg-Thieme-Verlag, Stuttgart), to be precise under reaction conditions which are known and suitable for said reactions. Use may also be made here of variants which are known per se, but are not mentioned here.

Unless the context clearly indicates otherwise, as used herein plural forms of the terms herein are to be construed as including the singular form and vice versa.

Throughout this application, unless explicitly stated otherwise, all concentrations are given in weight percent and relate to the respective complete mixture, all temperatures are given in degrees centigrade (Celsius) and all differences of temperatures in degrees centigrade.

Throughout the description and claims of this specification, the words "comprise" and "contain" and variations of the words, for example "comprising" and "comprises", mean "including but not limited to", and are not intended to (and do not) exclude other components. On the other hand, the word "comprise" also encompasses the term "consisting of" but is not limited to it.

It will be appreciated that variations to the foregoing embodiments of the invention can be made while still falling within the scope of the invention. Each feature disclosed in this specification, unless stated otherwise, may be replaced by alternative features serving the same, equivalent, or similar purpose. Thus, unless stated otherwise, each feature disclosed is only one example of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention.

Independent protection may be sought for these features in addition to, or alternative to any invention presently claimed.

The invention will now be described in more detail by reference to the following examples, which are illustrative only and do not limit the scope of the invention.

EXAMPLES

Example 1

Preparation of $(Ca_{0.8})(Mg_{0.65}Al_{0.15})(Si_{1.85}Al_{0.15})O_6$: $Mn^{2+}{}_{0.2}Eu^{2+}{}_{0.2}$ Via the Co-Precipitation Method $AlCl_3 \times 6H_2O$ (0.0075 mol, Merck), $CaCl_2 \times 2H_2O$ (0.0200 mol, Merck), $SiO_2$ (0.0463 mol, Merck), $EuCl_3 \times 6H_2O$ (0.0050 mol, Auer-Remy), $MnCl_2 \times 4H_2O$ (0.0050 mol, Merck), and $MgCl_2 \times 4H_2O$ (0.0163 mol, Merck) are dissolved in deionised water. $NH_4HCO_3$ (0.5 mol, Merck) is dissolved separately in deionised water. The two aqueous solutions are simultaneously stirred into deionised water. The combined solution is heated to 90° C. and evaporated to dryness. The residue is annealed at 1000° C. for 4 hours under an oxidative atmosphere. The resulting oxide material is annealed at 1000° C. for 4 hours under a reductive atmosphere. After conventional purification steps (washing with water and drying), the desired $(Ca_{0.8}Eu_{0.2})(Mg_{0.65}Mn_{0.2}Al_{0.15})(Si_{1.85}Al_{0.15})O_6$ is characterized by the XRD (cf. FIG. 1).

Figure 2:
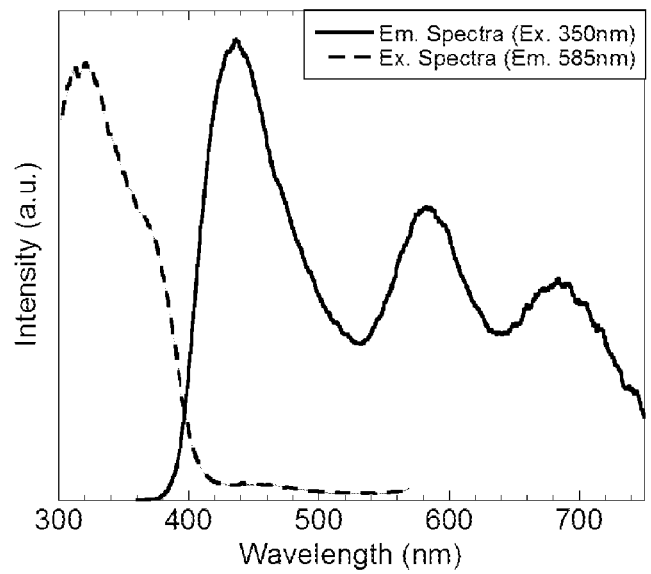
FIG. 2 shows an emission spectrum $(Ca_{0.8})(Mg_{0.65}Al_{0.15})(Si_{1.85}Al_{0.15})O_6: (Mn^{2+})_{0.2}(Eu^{2+})_{0.2}$ prepared by the co-precipitation method as illustrated in Example 1 upon excitation with radiation at a wavelength of 350 nm. The phosphor emits light having main emission maxima at approximately 680 nm, approximately 580 nm and approximately 440 nm.

The composition ratio of the phosphor (Al/Si ratio) is confirmed by WDX. The phosphor emits a bright red light having two main peaks at 435 and 585 nm upon excitation at 350 nm (cf. FIG. 2).

The emission intensity of 680 nm (which has low spectral sensitivity to the human eye) decreased upon the addition of Al to the $CaMgSi_2O_6$:EuMn phosphor.

Example 2

Figure 3:
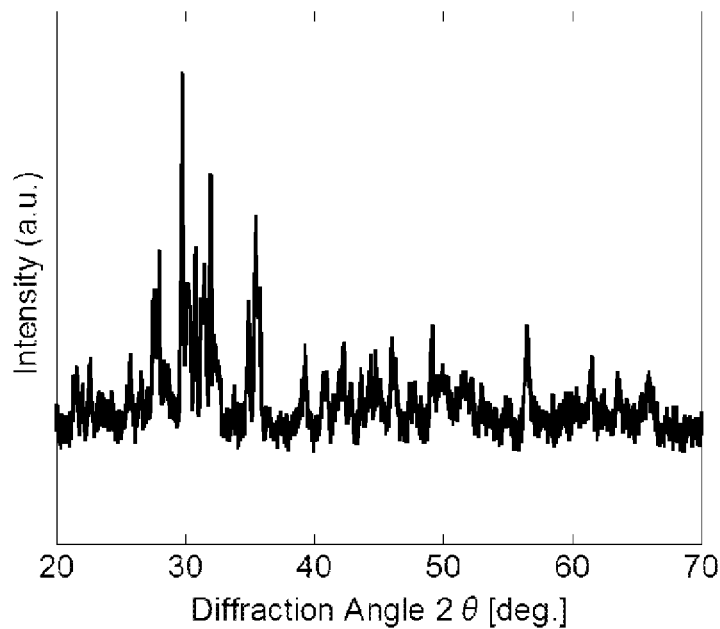
FIG. 3 shows a XRD pattern (measured by the wavelength $Cu_{K\alpha}$) of $(Ca_{0.8})(Mg_{0.5}Al_{0.3})(Si_{1.7}Al_{0.3})O_6:(Mn^{2+})_{0.2}(Eu^{2+})_{0.2}$ prepared by the co-precipitation method as illustrated in Example 2.

Preparation of $(Ca_{0.8})(Mg_{0.5}Al_{0.3})(Si_{1.7}Al_{0.3})O_6$: $Mn^{2+}_{0.2}Eu^{2+}_{0.2}$ Via the Co-Precipitation Method $AlCl_3 \cdot 6H_2O$ (0.0150 mol, Merck), $CaCl_2 \cdot 2H_2O$ (0.0200 mol, Merck), $SiO_2$ (0.0425 mol, Merck), $EuCl_3 \cdot 6H_2O$ (0.0050 mol, Auer-Remy), $MnCl_2 \cdot 4H_2O$ (0.0050 mol, Merck), and $MgCl_2 \cdot 4H_2O$ (0.0125 mol, Merck) are dissolved in deionised water. $NH_4HCO_3$ (0.5 mol, Merck) is dissolved separately in deionised water. The two aqueous solutions are then simultaneously stirred into deionised water. The resulting solution is heated to 90° C. and evaporated to dryness. The remaining solid is annealed at 1000° C. for 4 hours under an oxidative atmosphere. The resultant oxide materials are annealed at 1000° C. for 4 hours under a reductive atmosphere. After performing conventional purification steps using water and drying, $(Ca_{0.8})(Mg_{0.5}Al_{0.3})(Si_{1.7}Al_{0.3})O_6$: $Mn^{2+}_{0.2}Eu^{2+}_{0.2}$ is obtained and characterized by XRD techniques (FIG. 3).

Figure 4:
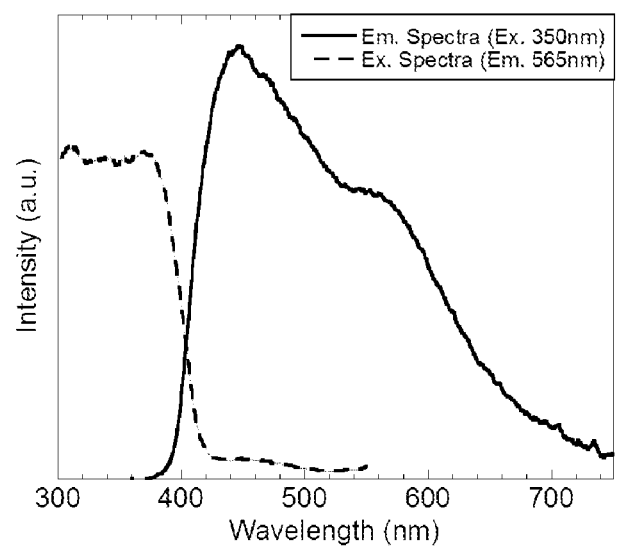
FIG. 4 shows an emission spectrum of $(Ca_{0.8})(Mg_{0.5}Al_{0.3})(Si_{1.7}Al_{0.3})O_6: (Mn^{2+})_{0.2}(Eu^{2+})_{0.2}$ prepared by the co-precipitation method as illustrated in Example 2 upon excitation with radiation at a wavelength of 350 nm. The phosphor emits light having main emission maxima at approximately 690 nm and approximately 560 nm.

The composition ratio of the phosphor (Al/Si ratio) is confirmed by WDX. The phosphor emits upon excitation with light of 350 nm a bright red light with two emission peaks centred at 435 and 585 nm (FIG. 4).

The emission intensity at a wavelength of 680 nm (which has a low spectral sensitivity to the human eye) decreased upon addition of Al to the $CaMgSi_2O_6$:EuMn phosphor.

Example 3

Figure 5:
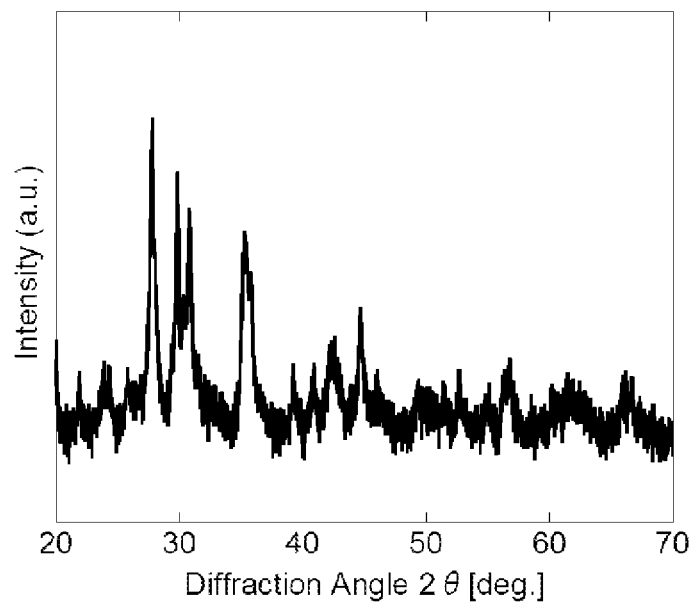
FIG. 5 shows the XRD pattern (measured by wavelength $Cu_{K\alpha}$) of $(Ca_{0.64}Sr_{0.16})(Mg_{0.65}Al_{0.15})(Si_{1.85}\ Al_{0.15})O_6:(Mn^{2+})_{0.2}(Eu^{2+})_{0.2}$ prepared by the micro reaction system as illustrated in Example 3
Figure 6:
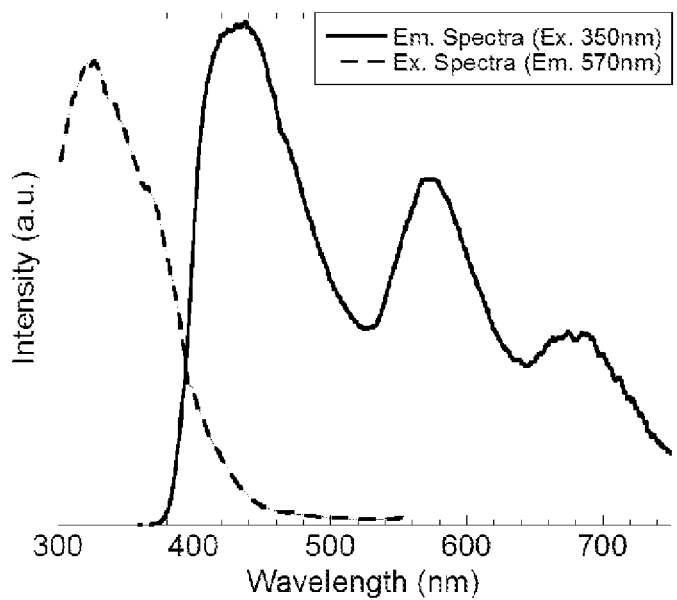
FIG. 6 shows the emission spectrum of $(Ca_{0.64}Sr_{0.16})(Mg_{0.65}Al_{0.15})(Si_{1.85}\ Al_{0.15})O_6:(Mn^{2+})_{0.2}(Eu^{2+})_{0.2}$ prepared by a micro-reaction system as illustrated in Example 3 upon excitation with radiation at a wavelength of 350 nm. The phosphor emits light having main emission maxima at approximately 680 nm, approximately 570 nm and approximately 440 nm.
Figure 7:
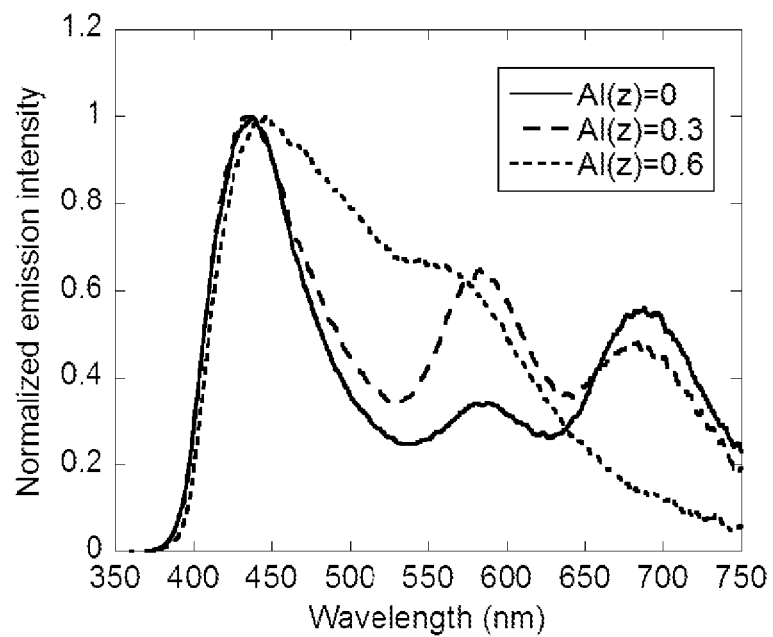
FIG. 7 shows the emission spectra of $(Ca_{0.8})(Mg_{0.8})Si_2O_6: (Mn^{2+})_{0.2}(Eu^{2+})_{0.2}$; $(Ca_{0.8})(Mg_{0.65}Al_{0.15})(Si_{1.85}Al_{0.15})O_6: (Mn^{2+})_{0.2}(Eu^{2+})_{0.2}$ and $(Ca_{0.8})(Mg_{0.5}Al_{0.3})(Si_{1.7}Al_{0.3})O_6:(Mn^{2+})_{0.2}(Eu^{2+})_{0.2}$ upon excitation with radiation at a wavelength of 350 nm.

Preparation of $(Ca_{0.64}Sr_{0.16})(Mg_{0.65}Al_{0.15})(Si_{1.85}Al_{0.15})O_6$: $Mn^{2+}_{0.2}Eu^{2+}_{0.2}$ Via the Micro Reaction Method The influence of the product has been investigated by changing the tube diameter and flow rate. Tube diameter influences activators distribution, and flow rate influences the crystalline. $AlCl_3 \cdot 6H_2O$ (0.0075 mol, Merck), $CaCl_2 \cdot 2H_2O$ (0.0160 mol, Merck), $SrCl_2 \cdot 2H_2O$ (0.0040 mol, Merck), $SiO_2$ (0.0463 mol, Merck), $EuCl_3 \cdot 6H_2O$ (0.0050 mol, Auer-Remy), $MnCl_2 \cdot 4H_2O$ (0.0050 mol, Merck), and $MgCl_2 \cdot 4H_2O$ (0.0125 mol, Merck) are dissolved together in deionised water. Then, $NH_4HCO_3$ (0.5 mol, Merck) is dissolved separately in deionised water. The solutions are pumped at the same time and driven a reaction at the connector. The reaction solution is passed through the tube at about 60° C. Precursors are caught in a beaker. The resultant solution is evaporated to dryness at about 90° C., and the resultant solid is annealed at 1000° C. for 4 hours in the oxidation atmosphere. The resultant oxide materials are annealed at 1000° C. for 4 hours in the reduction atmosphere. After conventional purification steps using water and drying are performed, the desired $(Ca_{0.64}Sr_{0.16})(Mg_{0.65}Al_{0.15})(Si_{1.85}Al_{0.15})O_6$: $Mn^{2+}_{0.2}Eu^{2+}_{0.2}$ is formed as evidenced by XRD pattern (cf. FIG. 5). The composition ratio of the phosphor (Al/Si ratio) was confirmed by WDX. The phosphor emits a bright red light peaking at 435 and 585 nm upon 350 nm light excitation (FIG. 6).

The emission intensity at a wavelength of 680 nm (which has a low spectral sensitivity to the human eye) decreased upon addition of Al to the $CaMgSi_2O_6$:EuMn phosphor.

Example 4

White LED with a 380 nm-Emitting LED Chip Using $(Ca_{0.8}Eu_{0.2})(Mg_{0.5}Mn_{0.2}Al_{0.3})(Si_{1.7}Al_{0.3})O_6$ Phosphor The phosphor from Example 2, $(Ca_{0.8})(Mg_{0.5}Al_{0.3})(Si_{1.7}Al_{0.3})O_6$: $Mn^{2+}_{0.2}Eu^{2+}_{0.2}$ is mixed in a tumble mixer with a silicone resin system OE 6550 (Dow Corning). The final concentration of phosphor in the silicone is 8 molpercentage. The slurry is applied to an InGaN-based LED chip emitting a wavelength of 380 nm.

The resulting illumination unit emits light with white colour, CIE 1937 (x, y)=(0.28, 0.31).

Example 5

Measurement of Thermal Quenching

The phosphor of Example 1 is placed in a sample holder.

The holder is placed to an FP6500 (JASCO) under a thermal controller (JASCO) which serves as its TQ measurement system.

The intensity of the emission spectra of the phosphor, which ranges from 380 nm to 780 nm is measured by the FP6500 in dependence of the increasing temperature starting at 25° C. and increased by increments of 25° C. up to 100° C.

A 150 W xenon lamp with an excitation wavelength of 350 nm is used as the excitation light source.

A comparative phosphor having the formula $CaMgSi2O6$: $Eu^{2+}Mn^{2+}$ is placed in the sample holder and the experiment is performed in the same manner as the phosphor from Example 1.

Figure 8:
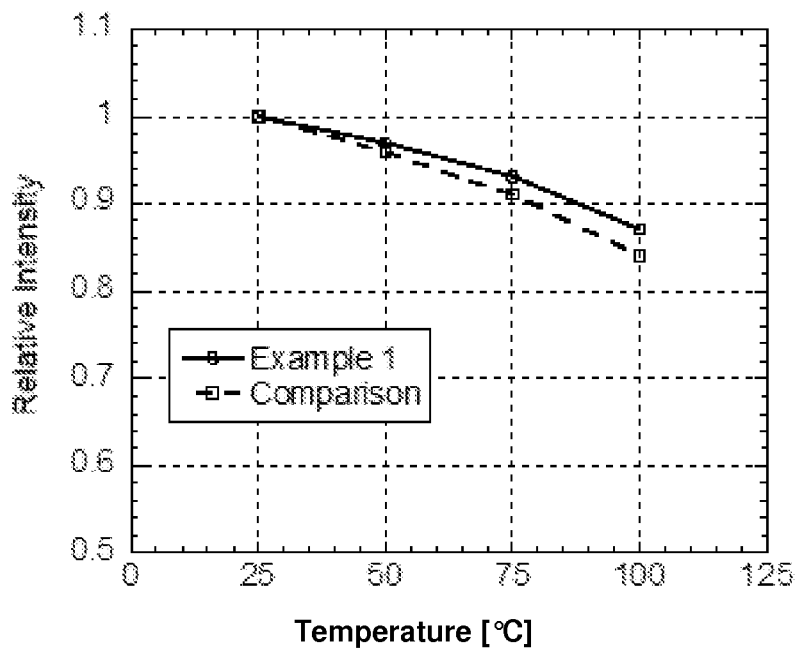
FIG. 8 shows the integrated emission intensity of the phosphor of Example 1 $(Ca_{0.8})(Mg_{0.65}Al_{0.15})(Si_{1.85}Al_{0.15})O_6:(Mn^{2+})_{0.2}(Eu^{2+})_{0.2}$ and in comparison the integrated emission intensity of the comparative example $(CaMgSi_2O_6: Eu^{2+}Mn^{2+})$.

As a result, the integrated emission intensity of the phosphor of Example 1 is 5% higher than the integrated emission intensity of the comparative example (cf. FIG. 8). This result clearly shows the efficacy of the thermal quenching resistivity of phosphors according to the present invention.

The invention claimed is:

1. A compound of formula Ia

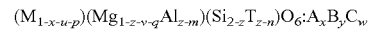   Ia $(M_{1-x-u-p})(Mg_{1-z-v-q}Al_{z-m})(Si_{2-z}T_{z-n})O_6:A_xB_yC_w$ wherein M denotes at least one alkaline earth element selected from the group consisting of Ca, Sr, and Ba, T denotes at least one trivalent element selected from the group consisting of Al, Ga, In, and Sc, A and B denote differently from each other, a divalent element selected from the group consisting of $Pb^{2+}$, $Mn^{2+}$, $Yb^{2+}$, $Sm^{2+}$, $Eu^{2+}$, $Dy^{2+}$, and $Ho^{2+}$, and C denotes a trivalent element selected from the group consisting of $Y^{3+}$, $La^{3+}$, $Ce^{3+}$, $Pr^3$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, and $Bi^{3+}$, with the proviso that at least two elements selected from the group consisting of A, B and C have to be present, m+n++p=w, wherein m≥0, n≥0, p≥0 and q≥0, u+v=y, wherein v≥0, u≥0, 0≤w≤0.3, 0≤x<0.5, 0≤y<0.5, wherein at least two of w, x and v have to be larger than 0, and 0<z<0.5.

2. The compound according to claim 1, wherein T denotes Al.

3. The compound according to claim 2, wherein w=0.

4. The compound according to claim 1, wherein A denotes $Eu^{2+}$.

5. The compound according to claim 1, wherein B denotes $Mn^{2+}$.

6. The compound according to claim 1, which is a compound of one of the following formulae Ia-1 to Ia-7

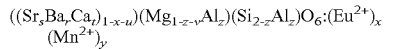  Ia-1

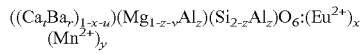  Ia-2

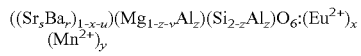  Ia-3

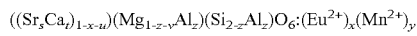  Ia-4

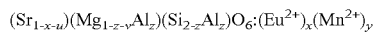  Ia-5

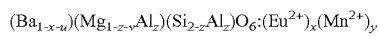  Ia-6

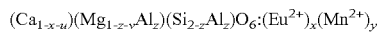  Ia-7 wherein
$0<r<1$; $0<s<1$; $0<t<1$; wherein $r+s+t=1$,
$u+v=y$, wherein $v≥0$ and $u≥0$ and wherein at least one of u and v has to be larger than 0,
$0.1<x<0.3$,
$0.1<y<0.2$, and
$0.05<z<0.4$.

7. The compound according to claim 1, wherein T denotes Al, A denotes $Eu^{2+}$ and B denotes $Mn^{2+}$.

8. The compound according to claim 7, wherein w=0.

9. A process for preparing the compound according to claim 1, comprising the following steps:
a) mixing a silicon-containing agent, a mixture of salts comprising at least the elements of Mg, Al, M and T and one or more salts comprising at least two elements selected from the group consisting of A, B and C at a predetermined molar ratio in a solvent;
b) adding a precipitation agent;
c) performing a primary heat treatment on the mixture in a temperature range of 800 to 1300° C. under an oxidative atmosphere; and
d) performing a secondary heat treatment on the mixture in a temperature range of 800 to 1300° C. under a reductive atmosphere.

10. The process according to claim 9, wherein the salts in step a) are selected from the group consisting of nitrates, halogenides, hydrogensulfates and carbonates.

11. The process according to claim 9, wherein the precipitation agent in step b) is selected from the group consisting of sodium hydrogen carbonate, ammonium chloride, and ammonium hydrogen carbonate.

12. The process according to claim 9, wherein the silicon-containing agent in step a) is an inorganic silicon compound or an organic silicon compound.

13. A phosphor mixture comprising at least one compound according to claim 1.

14. An illumination unit, which has at least one light source with an emission maximum in the range of 280 nm to 400 nm, and all or some of whose radiation is converted into longer-wavelength radiation by a compound according to claim 1.

15. The illumination unit according to claim 14, wherein the light source is a luminescent indium aluminium gallium nitride.

16. A method for converting UV or near-UV emission to longer wavelength radiation, comprising exposing said UV or near-UV emission to a compound of claim 1.

17. A solar cell comprising a compound of claim 1 as a wavelength conversion material.

18. An illumination unit, which has at least one light source with an emission maximum in the range of 280 nm to 400 nm, and all or some of whose radiation is converted into longer-wavelength radiation by a compound according to claim 6.

19. A method for converting UV or near-UV emission to longer wavelength radiation, comprising exposing said UV or near-UV emission to a compound of claim 6.

20. A solar cell comprising a compound of claim 6 as a wavelength conversion material.

* * * * *